US012668881B2

(12) United States Patent
Wittig

(10) Patent No.: US 12,668,881 B2
(45) Date of Patent: Jun. 30, 2026

(54) PEDESTAL INCLUDING VAPOR CHAMBER FOR SUBSTRATE PROCESSING SYSTEMS

(71) Applicant: LAM RESEARCH CORPORATION, Fremont, CA (US)

(72) Inventor: Michael Wittig, Santa Clara, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 989 days.

(21) Appl. No.: 17/295,935

(22) PCT Filed: Nov. 26, 2019

(86) PCT No.: PCT/US2019/063238
§ 371 (c)(1),
(2) Date: May 21, 2021

(87) PCT Pub. No.: WO2020/112764
PCT Pub. Date: Jun. 4, 2020

(65) Prior Publication Data
US 2022/0002866 A1 Jan. 6, 2022

Related U.S. Application Data

(60) Provisional application No. 62/772,364, filed on Nov. 28, 2018.

(51) Int. Cl.
*C23C 16/458* (2006.01)
*C23C 16/46* (2006.01)

(52) U.S. Cl.
CPC ........ *C23C 16/4586* (2013.01); *C23C 16/463* (2013.01)

(58) Field of Classification Search
None
See application file for complete search history.

(56) References Cited

U.S. PATENT DOCUMENTS

| | | | |
|---|---|---|---|
| 4,579,080 A | 4/1986 | Martin et al. | |
| 4,947,789 A | 8/1990 | Hussla et al. | |
| 5,220,171 A | 6/1993 | Hara et al. | |
| 5,859,408 A | 1/1999 | Baxendine | |
| 5,894,887 A | 4/1999 | Kelsey et al. | |
| 6,503,368 B1 | 1/2003 | Kholodenko et al. | |

(Continued)

FOREIGN PATENT DOCUMENTS

| | | |
|---|---|---|
| CN | 1864241 A | 11/2006 |
| CN | 101802272 A | 8/2010 |

(Continued)

OTHER PUBLICATIONS

International Search Report and Written Opinion of the ISA issued in PCT/US2019/063238, mailed Mar. 20, 2020; ISA/KR.

(Continued)

*Primary Examiner* — Jeffrie R Lund
*Assistant Examiner* — Tiffany Z Nuckols

(57) ABSTRACT

A substrate support for a substrate processing system includes a pedestal including an upper surface and a lower surface. A vapor chamber is arranged between the pedestal and a baseplate, defines a vapor chamber cavity and includes a plurality of capillary structures arranged on a surface inside of the vapor chamber cavity.

27 Claims, 3 Drawing Sheets

(56)  References Cited

U.S. PATENT DOCUMENTS

| | | | |
|---|---|---|---|
| 2003/0228772 A1 * | 12/2003 | Cowans | H01L 21/67109 |
| | | | 118/724 |
| 2004/0084143 A1 | 5/2004 | Ivanov et al. | |
| 2005/0235918 A1 | 10/2005 | Kojima et al. | |
| 2006/0207750 A1 | 9/2006 | Chang et al. | |
| 2007/0004232 A1 | 1/2007 | Shareef et al. | |
| 2007/0224777 A1 | 9/2007 | Hamelin | |
| 2009/0041624 A1 | 2/2009 | Hochmuth et al. | |
| 2009/0159566 A1 | 6/2009 | Brillhart et al. | |
| 2012/0111271 A1 | 5/2012 | Begarney et al. | |
| 2014/0027092 A1 | 1/2014 | Ranish et al. | |
| 2014/0356985 A1 * | 12/2014 | Ricci | C23C 16/4586 |
| | | | 118/712 |
| 2015/0176928 A1 * | 6/2015 | Tabuchi | G05D 23/1951 |
| | | | 165/96 |
| 2017/0081764 A1 | 3/2017 | Aburatani et al. | |
| 2017/0110298 A1 | 4/2017 | Ricci et al. | |
| 2018/0145382 A1 | 5/2018 | Harris et al. | |
| 2018/0374737 A1 * | 12/2018 | Margavio | H01L 21/67103 |
| 2019/0249911 A1 * | 8/2019 | Yamaguchi | H01L 21/67017 |

FOREIGN PATENT DOCUMENTS

| | | | |
|---|---|---|---|
| CN | 105722372 A | 6/2016 |
| CN | 107799391 A | 3/2018 |
| CN | 108330461 A | 7/2018 |
| CN | 108335993 A | 7/2018 |
| JP | H0521308 A | 1/1993 |
| JP | H05021308 A | 1/1993 |
| JP | 2007043170 A | 2/2007 |
| JP | 2007257014 A | 10/2007 |
| WO | WO-2009049020 A2 | 4/2009 |

OTHER PUBLICATIONS

"Introduction to Energy Saving", edited by Long Yan et al., p. 142, Huazhong University of Science and Technology Press, Dec. 2017 2nd edition, 1st printing.

Chinese Reexamination Notice for Chinese Application No. 201980077518.6 dated Oct. 17, 2024.

Chinese Office Action for Chinese Application No. 201980077518.6 dated Oct. 24, 2022.

Taiwanese Office Action for Taiwanese Application No. 108143047 dated Jun. 27, 2023.

* cited by examiner

PEDESTAL INCLUDING VAPOR CHAMBER FOR SUBSTRATE PROCESSING SYSTEMS

CROSS-REFERENCE TO RELATED APPLICATIONS

This application is a U.S. National Phase Application under 35 U.S.C. 371 of International Application No. PCT/US2019/063238, filed on Nov. 26, 2019, which claims the benefit of U.S. Provisional Application No. 62/772,364, filed on Nov. 28, 2018. The entire disclosures of the applications referenced above are incorporated herein by reference.

FIELD

The present disclosure relates to substrate processing systems, and more particularly to pedestal temperature control systems for substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems typically include a processing chamber that includes a pedestal. A substrate such as a semiconductor wafer may be arranged on the pedestal. For example in chemical vapor deposition (CVD) processes, a gas mixture may be introduced into the processing chamber to deposit a film on the substrate or to etch the substrate. In some situations, plasma may be used. It may be desirable to control a temperature of the pedestal and the substrate during processing to improve uniformity of etching or deposition.

To improve temperature uniformity, some systems use multiple heaters that are embedded in different heating zones of the pedestal. For example, the heaters may be arranged at different radii of the pedestal. Thermocouples may be used to monitor the temperatures in the heating zones. A control system controls power to each heating zone to create temperature uniformity based on measured temperatures of the pedestal in the different zones. If sensing is not performed in real time, different types of processes may require different heater calibrations. The control system for the heaters may be expensive and may introduce points of failure to the substrate processing system.

Despite the use of different heating zones, localized temperature differences may still occur. In an effort to further increase temperature uniformity, some systems have added as many as 30 heaters to achieve a high level of temperature uniformity, which increases cost and complexity. These systems may still not achieve the desired amount of temperature uniformity.

SUMMARY

A substrate support for a substrate processing system includes a pedestal including an upper surface and a lower surface. A vapor chamber is arranged between the pedestal and a baseplate, defines a vapor chamber cavity and includes a plurality of capillary structures arranged on a surface inside of the vapor chamber cavity.

In other features, the baseplate includes fluid passages in thermal communication with a lower surface of the vapor chamber. The fluid passages are arranged in a spiral pattern. A cover is arranged over the fluid passages adjacent to the lower surface of the vapor chamber. A working fluid is located in the vapor chamber, the plurality of capillary structures are arranged on a lower surface of the vapor chamber and further comprising a fluid supply configured to supply a fluid to the fluid passages having a higher temperature than the working fluid to cause the working fluid on the plurality of capillary structures to vaporize and condense on cooler surfaces in the vapor chamber cavity.

In other features, a working fluid is located in the vapor chamber, the plurality of capillary structures are arranged on an upper surface of the vapor chamber, and heat from the pedestal causes the working fluid on the plurality of capillary structures to vaporize and condense on cooler surfaces in the vapor chamber cavity. A fluid supply is configured to supply a fluid to the fluid passages having a lower temperature than the working fluid. The plurality of capillary structures is arranged on at least one of a lower surface, an upper surface and sidewalls of the vapor chamber cavity.

In other features, the vapor chamber performs heating and the plurality of capillary structures are arranged on a lower surface of the vapor chamber cavity.

In other features, the vapor chamber performs cooling and the plurality of capillary structures are arranged on an upper surface of the vapor chamber cavity. The plurality of capillary structures move a working fluid in the vapor chamber cavity by capillary action. The plurality of capillary structures include a wicking material that moves a working fluid in the vapor chamber cavity by capillary action. The plurality of capillary structures include fabric that moves a working fluid in the vapor chamber cavity by capillary action. The plurality of capillary structures include a sintered powdered material that moves a working fluid in the vapor chamber cavity by capillary action. The plurality of capillary structures include a grooved material that moves a working fluid in the vapor chamber cavity by capillary action.

A vapor chamber for a substrate support of a substrate processing system includes a body including an upper surface, a lower surface and side walls defining a vapor chamber cavity. A plurality of capillary structures is arranged on at least one of an upper surface, a lower surface and side walls inside of the vapor chamber cavity. The vapor chamber is configured to be arranged between a pedestal and a baseplate of the substrate support.

In other features, a working fluid is located in the vapor chamber. The vapor chamber supplies heat to the pedestal. The plurality of capillary structures are arranged on a lower surface of the vapor chamber to vaporize the working fluid and condense the working fluid on cooler surfaces in the vapor chamber cavity.

In other features, a working fluid is located in the vapor chamber, the vapor chamber performs cooling of the pedestal, and the plurality of capillary structures are arranged on an upper surface of the vapor chamber to vaporize the working fluid and condense the working fluid on cooler surfaces in the vapor chamber cavity.

In other features, the plurality of capillary structures include a wicking material that moves a working fluid in the vapor chamber cavity by capillary action. The plurality of capillary structures include fabric that moves a working fluid in the vapor chamber cavity by capillary action. The plurality of capillary structures include a sintered powdered material that moves a working fluid in the vapor chamber cavity by capillary action. The plurality of capillary structures include a grooved material that moves a working fluid in the vapor chamber cavity by capillary action.

A method for manufacturing a substrate support for a substrate processing system include defining a vapor chamber cavity in a vapor chamber body; arranging a plurality of capillary structures arranged on a surface inside of the vapor chamber cavity; and arranging the vapor chamber body between a pedestal and a baseplate.

In other features, the method includes defining fluid passages in the baseplate, wherein the fluid passages are in thermal communication with a lower surface of the vapor chamber body. The method includes arranging the fluid passages in a spiral pattern. The method includes arranging a cover over the fluid passages adjacent to the lower surface of the vapor chamber.

In other features, the method includes arranging the plurality of capillary structures on a lower surface of the vapor chamber; and supplying a working fluid in the vapor chamber body. The method includes arranging the plurality of capillary structures on an upper surface of the vapor chamber; and supplying a working fluid in the vapor chamber body.

In other features, the plurality of capillary structures include a wicking material that moves a working fluid in the vapor chamber cavity by capillary action. The plurality of capillary structures include fabric that moves a working fluid in the vapor chamber cavity by capillary action. The plurality of capillary structures include a sintered powdered material that moves a working fluid in the vapor chamber cavity by capillary action. The plurality of capillary structures include a grooved material that moves a working fluid in the vapor chamber cavity by capillary action.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

According to the present disclosure, a temperature of a pedestal is controlled using a vapor chamber that is arranged below the pedestal.

Figure 1:
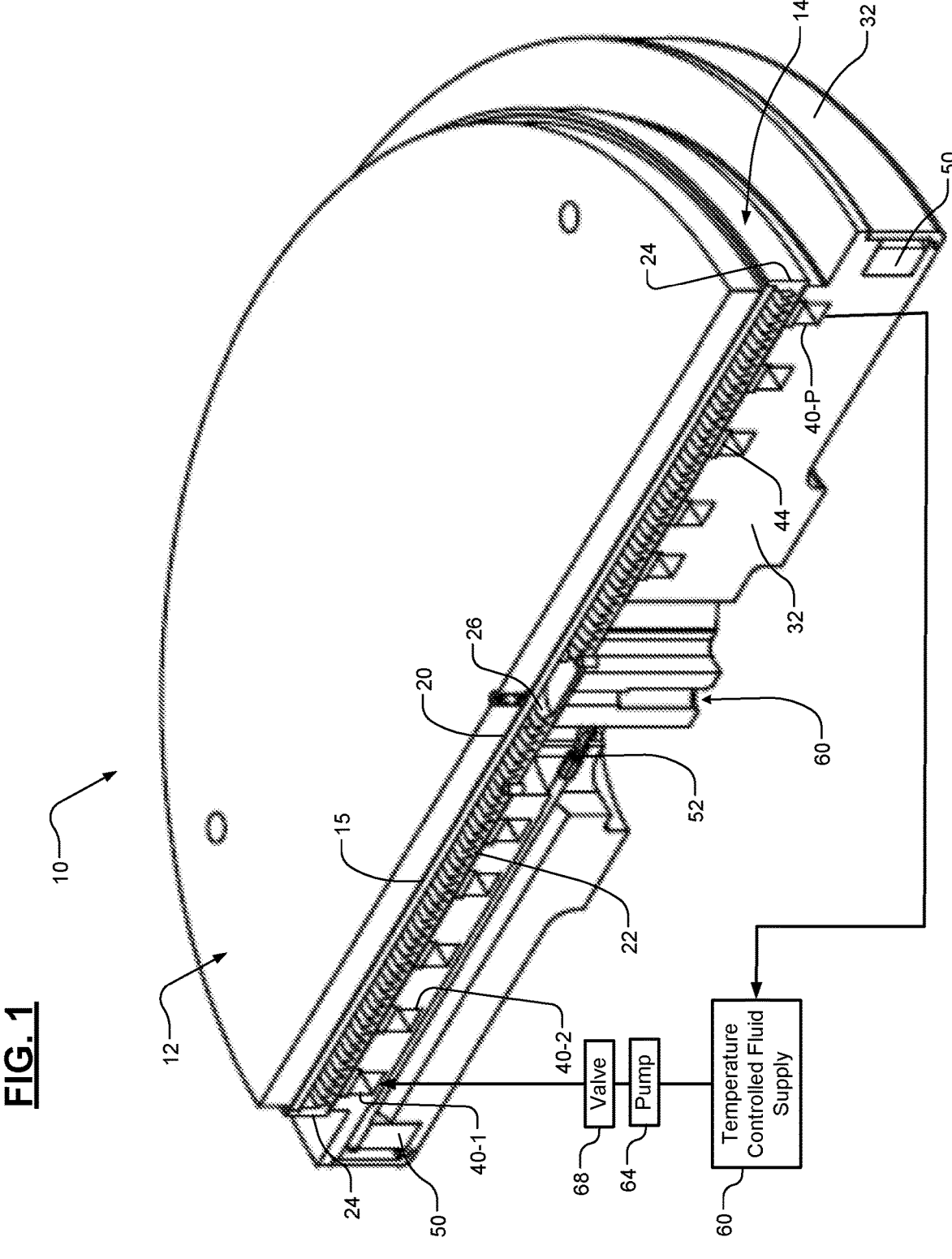
FIG. 1 is a partial perspective view of a pedestal including a vapor chamber according to the present disclosure.
Figure 2:
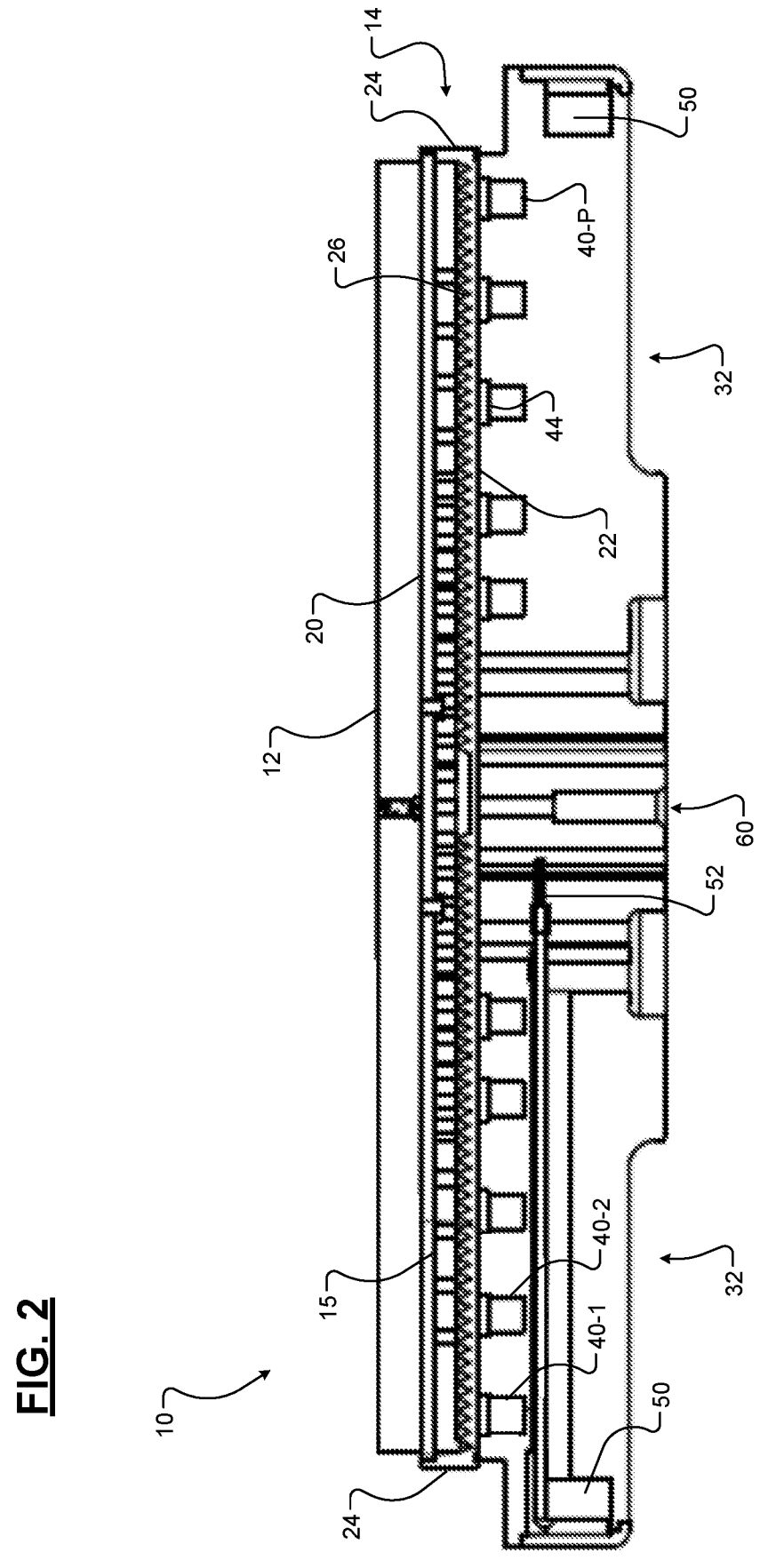
FIG. 2 is a cross-sectional view of a pedestal including a vapor chamber according to the present disclosure.
Figure 3:
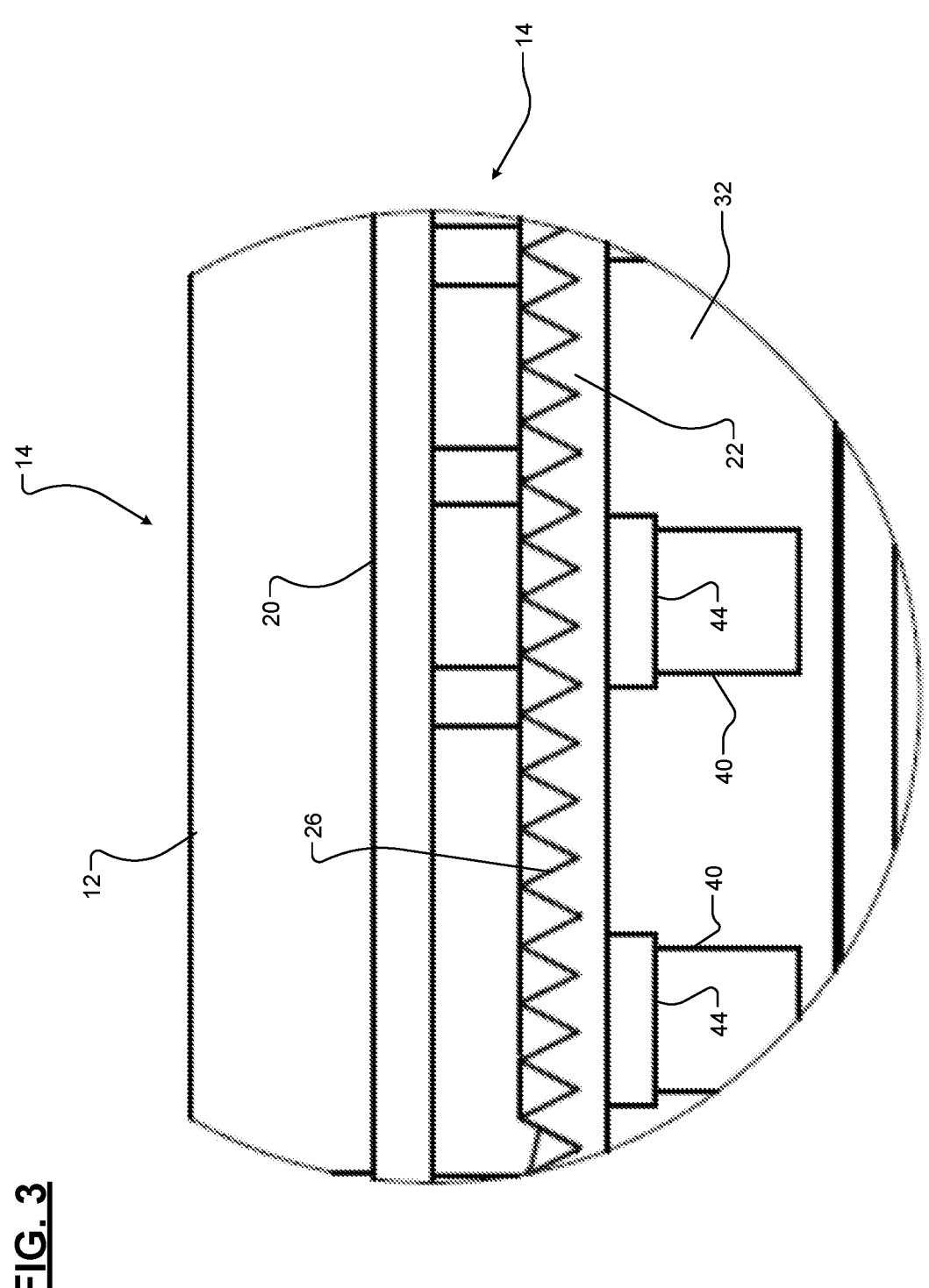
FIG. 3 is a partial cross-sectional view of a pedestal including a vapor chamber according to the present disclosure.

Referring now to FIGS. 1, 2 and 3, pedestal temperature control system 10 includes a pedestal 12 and a vapor chamber 14 arranged to control a temperature of the pedestal 12. In some examples, the pedestal 12 includes a ceramic base material having an outer surface that is plated. In some examples, the ceramic material includes aluminum nitride (AlN), although other materials may be used. In some examples, the pedestal is an electrostatic chuck that uses electrostatic charge to hold the substrate in place during substrate processing, although mechanical or other types of chuck may be used.

In some examples, the vapor chamber 14 defines a vapor chamber cavity 15 that is in a form of a disk or flat cylindrical cavity. The vapor chamber cavity 15 of the vapor chamber 14 is defined by an upper surface 20, a lower surface 22, and side walls 24 arranged around an outer periphery of the flat cylindrical opening. A working fluid located in the vapor chamber 14 is used to provide heating or cooling within the vapor chamber 14 as needed to increase temperature uniformity.

An inwardly facing side of the lower surface 22 includes a plurality of capillary structures 26. For example only, the capillary structures 26 may include a wicking material, fabric, a powdered material such as a metallic or nonmetallic powder, grooves or other structures that can move fluid by capillary action. In some examples, the metallic powder is sintered to an inner side of the lower surface 22 of the vapor chamber 14. As can be appreciated, the capillary structures 26 may also be formed on an inner side of the upper surface 20 and/or an inner side of the side walls 24.

A base portion 32 may be arranged below the vapor chamber 14. In some examples, the base portion 32 may be made of aluminum. The base portion 32 may define fluid passages 40-1, 40-2 . . . , and 40-P, where P is an integer (collectively fluid passages 40). For example only, the fluid passages 40 may be arranged in a spiral pattern or any other suitable pattern. Water or another type of fluid may flow in the fluid passages 40 to provide heating or cooling. A top portion of the fluid passages 40 may be enclosed by a cover 44. In some examples, the cover 44 is welded in place to seal the fluid passages 40.

A controller, one or more valves, one or more pumps, and thermocouples may be used to control a heated and/or cooled fluid source. For example in FIG. 1, a temperature-controlled fluid supply 60, a pump 64 and a valve 68 may be used to supply fluid at a predetermined temperature above or below the working fluid to the fluid passages 40.

One or more coils 50 may be provided to supply heat to the base portion 32. A connector 52 may be connected from a radially inner portion of the base portion 32 to the one or more coils 50 that are located adjacent to an outer circumference of the pedestal. Gas ("backside gas") may be supplied to a substrate resting on the pedestal 12 via passage 60. A lift pin assembly (not shown) may be used to lift the substrate from the pedestal 12.

In operation, the vapor chamber 14 encloses a working fluid. For example, another fluid that is hotter than the lower surface 22 of the vapor chamber 14 may be supplied by the heated fluid source to the fluid passages 40. The fluid in the fluid passages 40 supplies heat to the lower surface 22 of the vapor chamber 14. Working fluid located in the vapor chamber 14 on the lower surface 22 vaporizes. The vapor disburses uniformly inside the vapor chamber 14 and is condensed on cooler surfaces that are at a lower temperature. This action increases the temperature of these cooler surfaces. At the same time, working fluid on the capillary structures 26 replaces the working fluid that vaporizes. In this example, the heating action of the working fluid will tend to make all of the surfaces in the vapor chamber 14 have a more uniform temperature.

As can be appreciated, the vapor chamber 14 can also perform cooling. In this application, the capillary structures are arranged on the top surface of the vapor chamber instead of the bottom surface. For example, another fluid that is cooler than the lower surface 22 of the vapor chamber 14 may be supplied by a cooled fluid source to the fluid passages 40. The fluid in the fluid passages 40 cools the lower surface 22 of the vapor chamber 14. Working fluid located in the vapor chamber 14 on the lower surface 22 condenses and becomes liquid. The liquid is moved by capillary action to hotter surfaces inside the vapor chamber 14 and vaporizes on the hotter surfaces that are at a higher temperature. This action decreases the temperature of these hotter surfaces. At the same time, working fluid on the capillary structure 26 replaces the working fluid that vaporizes. In this example, the cooling action of the working fluid will tend to make all of the surfaces in the vapor chamber 14 have a more uniform temperature.

According to the present disclosure, temperature uniformity on the surface of the pedestal is achieved by creating a very high thermal conductivity sealed vapor chamber beneath a surface of a pedestal 12 that conducts heat at a high rate. For example only, heat may be conducted at a rate of 8,000-20,000 Watts per meter Kelvin (W/mK). Note that aluminum conducts at ~200 W/mK.

In use, vapor carrying heat may automatically be deposited on lower temperature surfaces, or even portions of surfaces, within the vapor chamber, thereby creating a system that is passively and continuously seeking thermal uniformity. The working fluid (e.g., water, alcohol, or other fluid) can be varied so as to be suitable to the temperature range desired of the pedestal and/or the materials used in making the vapor chamber. As a result, the need for many heating zones is reduced or eliminated.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

What is claimed is:

1. A substrate support for a substrate processing system, comprising:
   a pedestal including an upper surface and a lower surface;
   a baseplate including fluid passages coupled to the lower surface of the pedestal;
   a vapor chamber comprising a working fluid, the vapor chamber arranged between the pedestal and the baseplate, defining a vapor chamber cavity and including a plurality of capillary structures arranged on a surface inside of the vapor chamber cavity, the fluid passages in the baseplate being in thermal communication with a lower surface of the vapor chamber;
   a cover that seals the fluid passages and that is flush with an upper surface of the baseplate and directly contacts the lower surface of the vapor chamber; and
   a fluid supply configured to supply a fluid to the fluid passages at a first temperature to heat the lower surface of the vapor chamber and at a second temperature to cool the lower surface of the vapor chamber to control a temperature of the pedestal.

2. The substrate support of claim 1, wherein the fluid passages are arranged in a spiral pattern.

3. The substrate support of claim 1, wherein the plurality of capillary structures are arranged on the lower surface of the vapor chamber and wherein the fluid having a higher temperature than the working fluid causes the working fluid on the plurality of capillary structures to vaporize and condense on cooler surfaces in the vapor chamber cavity.

4. The substrate support of claim 1, wherein the plurality of capillary structures are arranged on an upper surface of the vapor chamber, and wherein heat from the pedestal causes the working fluid on the plurality of capillary structures to vaporize and condense on cooler surfaces in the vapor chamber cavity.

5. The substrate support of claim 1, wherein the plurality of capillary structures are arranged on at least one of a lower surface, an upper surface and sidewalls of the vapor chamber cavity.

6. The substrate support of claim 1, wherein the vapor chamber performs heating and the plurality of capillary structures are arranged on a lower surface of the vapor chamber cavity.

7. The substrate support of claim 1, wherein the vapor chamber performs cooling and the plurality of capillary structures are arranged on an upper surface of the vapor chamber cavity.

8. The substrate support of claim 1, wherein the plurality of capillary structures move the working fluid in the vapor chamber cavity by capillary action.

9. The substrate support of claim 1, wherein the plurality of capillary structures include a wicking material that moves the working fluid in the vapor chamber cavity by capillary action.

10. The substrate support of claim 1, wherein the plurality of capillary structures include fabric that moves the working fluid in the vapor chamber cavity by capillary action.

11. The substrate support of claim 1, wherein the plurality of capillary structures include a sintered powdered material that moves the working fluid in the vapor chamber cavity by capillary action.

12. The substrate support of claim 1, wherein the plurality of capillary structures include a grooved material that moves the working fluid in the vapor chamber cavity by capillary action.

13. A vapor chamber for a substrate support of a substrate processing system, comprising:
    a body including an upper surface, a lower surface and side walls defining a vapor chamber cavity; and
    a plurality of capillary structures arranged on at least one of an upper surface, a lower surface and side walls inside of the vapor chamber cavity,
    wherein the vapor chamber comprises a working fluid and is configured to be arranged between a pedestal and a baseplate of the substrate support,
    wherein a lower surface of the vapor chamber is in thermal communication with fluid passages disposed in the baseplate;
    a cover that seals the fluid passages and that is flush with an upper surface of the baseplate and directly contacts the lower surface of the vapor chamber; and
    a fluid supplied to the fluid passages at a first temperature to heat the lower surface of the vapor chamber and at a second temperature to cool the lower surface of the vapor chamber to control a temperature of the pedestal.

14. The vapor chamber of claim 13, wherein:
    the vapor chamber supplies heat to the pedestal, and
    the plurality of capillary structures are arranged on the lower surface of the vapor chamber to vaporize the working fluid and condense the working fluid on cooler surfaces in the vapor chamber cavity.

15. The vapor chamber of claim 13, wherein:

the vapor chamber performs cooling of the pedestal, and the plurality of capillary structures are arranged on an upper surface of the vapor chamber to vaporize the working fluid and condense the working fluid on cooler surfaces in the vapor chamber cavity.

16. The vapor chamber of claim 13, wherein the plurality of capillary structures include a wicking material that moves the working fluid in the vapor chamber cavity by capillary action.

17. The vapor chamber of claim 13, wherein the plurality of capillary structures include fabric that moves the working fluid in the vapor chamber cavity by capillary action.

18. The vapor chamber of claim 13, wherein the plurality of capillary structures include a sintered powdered material that moves the working fluid in the vapor chamber cavity by capillary action.

19. The vapor chamber of claim 13, wherein the plurality of capillary structures include a grooved material that moves the working fluid in the vapor chamber cavity by capillary action.

20. A method for manufacturing a substrate support for a substrate processing system, comprising:

defining a vapor chamber cavity in a vapor chamber body;

arranging a plurality of capillary structures arranged on a surface inside of the vapor chamber cavity;

arranging the vapor chamber body between a pedestal and a baseplate;

defining fluid passages in the baseplate, wherein the fluid passages are in thermal communication with a lower surface of the vapor chamber body;

arranging a cover to seal the fluid passages, the cover being flush with an upper surface of the baseplate and directly contacting the lower surface of the vapor chamber body; and supplying a fluid to the fluid passages at a first temperature to heat the lower surface of the vapor chamber body and at a second temperature to cool the lower surface of the vapor chamber body to control a temperature of the pedestal.

21. The method of claim 20, further comprising arranging the fluid passages in a spiral pattern.

22. The method of claim 20, further comprising:

arranging the plurality of capillary structures on the lower surface of the vapor chamber body; and supplying a working fluid in the vapor chamber body.

23. The method of claim 20, further comprising:

arranging the plurality of capillary structures on an upper surface of the vapor chamber body; and supplying a working fluid in the vapor chamber body.

24. The method of claim 20, wherein the plurality of capillary structures include a wicking material that moves a working fluid in the vapor chamber cavity by capillary action.

25. The method of claim 20, wherein the plurality of capillary structures include fabric that moves a working fluid in the vapor chamber cavity by capillary action.

26. The method of claim 20, wherein the plurality of capillary structures include a sintered powdered material that moves a working fluid in the vapor chamber cavity by capillary action.

27. The method of claim 20, wherein the plurality of capillary structures include a grooved material that moves a working fluid in the vapor chamber cavity by capillary action.

* * * * *